(12) United States Patent
Koehler

(10) Patent No.: US 6,866,552 B2
(45) Date of Patent: Mar. 15, 2005

(54) ELECTRICAL CONNECTOR WITH A TERMINAL PIN ALIGNMENT PLATE

(75) Inventor: David F. Koehler, Lake Orion, MI (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/374,964

(22) Filed: Feb. 21, 2003

(65) Prior Publication Data

US 2004/0166705 A1 Aug. 26, 2004

(51) Int. Cl.[7] .............................................. H01R 11/22
(52) U.S. Cl. ..................................................... 439/892
(58) Field of Search .......................... 439/79, 140, 141, 439/375, 892

(56) References Cited

U.S. PATENT DOCUMENTS 4,717,217 A * 1/1988 Bogese, II .................... 439/83
5,078,626 A * 1/1992 Matsuoka et al. .......... 439/892
5,591,036 A * 1/1997 Doi et al. ...................... 439/79

* cited by examiner

Primary Examiner—Ross Gushi
Assistant Examiner—Phuongchi Nguyen
(74) Attorney, Agent, or Firm—Stacey E. Caldwell

(57) ABSTRACT

An electrical connector includes a dielectric housing having a plurality of conductive terminals mounted thereon with pin portions projecting therefrom. A pin alignment plate has a plurality of apertures for receiving the pin portions of the terminals. The pin alignment plate is movably mounted on the housing for movement from a protecting position generally at distal ends of the pin portions to a pin-exposing position spaced inwardly of the distal ends. The pin alignment plate has latches for mounting a printed circuit thereon for movement therewith between said positions.

22 Claims, 7 Drawing Sheets

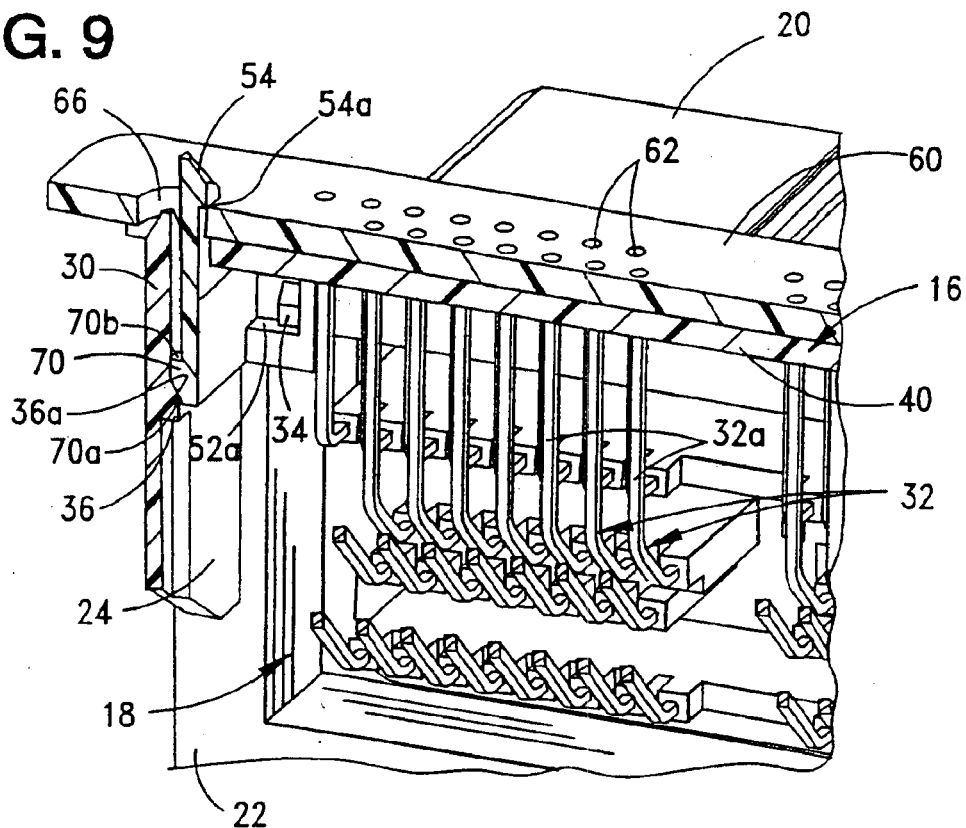
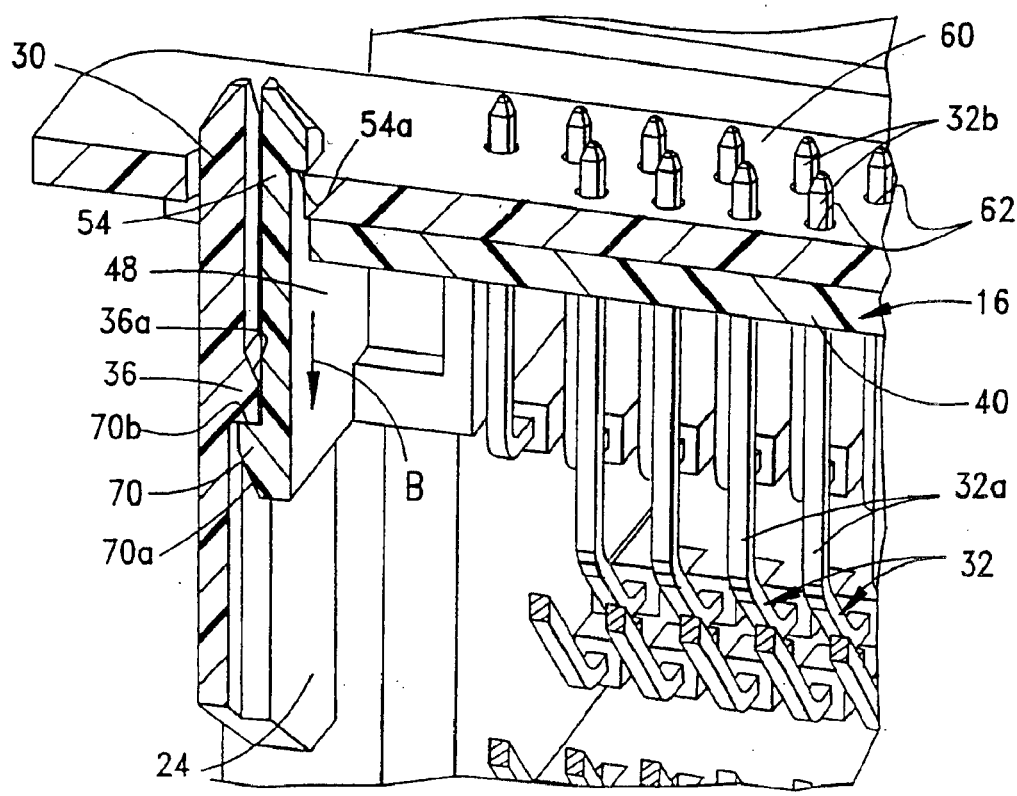

US 6,866,552 B2

ELECTRICAL CONNECTOR WITH A TERMINAL PIN ALIGNMENT PLATE

BACKGROUND OF THE INVENTION

This invention generally relates to the art of electrical connectors and, particularly, to an electrical connector which has a terminal pin alignment plate which mounts a printed circuit board thereon.

Generally, an electrical connector typically includes an insulating or dielectric housing which mounts a plurality of conductive terminals having contact portions for engaging the terminals of a complementary mating connector. The terminals also have terminating portions for connection to electrical conductors such as discrete electrical wires or the circuit traces on a printed circuit board. In many electrical connectors, the terminating portions of the terminals comprise pin portions for insertion into holes in a printed circuit board and for electrical connection to the circuit traces on the board and/or in the holes. Unfortunately, problems are encountered in bending or otherwise damaging the terminal pin portions. This problem is magnified with the ever-increasing miniaturization of electrical connectors, whereby such terminal pin portions are very small components.

Efforts have been made to provide protection for the pin portions of the terminals as described above. For instance, pin alignment plates have been used, wherein a plate has a plurality of holes for receiving the terminal pin portions to maintain the alignment and spacing of the pin portions and prevent bending thereof or damage thereto. The alignment plates may be removed or remain in place before the connector is mated, or it has been known to provide an arrangement whereby the alignment plate moves from an outer protecting position, inwardly along the pin portions to an inner mating position, such as during insertion of the pin portions into holes in a printed circuit board. The present invention is directed to a unique improvement in such systems wherein the terminal alignment plate is provided with means for mounting a printed circuit board thereto for movement therewith.

SUMMARY OF THE INVENTION

An object, therefore, of the invention is to provide a new and improved electrical connector with a pin alignment plate that mounts a printed circuit board thereon.

In the exemplary embodiment of the invention, the connector includes a dielectric housing having a plurality of conductive terminals mounted thereon with pin portions projecting therefrom. A pin alignment plate has a plurality of apertures for receiving the pin portions of the terminals. The pin alignment plate is movably mounted on the housing for movement from a protecting position generally at distal ends of the pin portions to a pin-exposing position spaced inwardly of the distal ends. The pin alignment plate includes means for mounting a printed circuit board thereon for movement therewith between said positions.

Other features of the invention include first complementary interengaging latch means between the pin alignment plate and the housing for holding the plate in its protecting position. Second complementary interengaging latch means are provided between the pin alignment plate and the housing for holding the plate in its pin-exposing position.

According to one aspect of the invention, the means for mounting the printed circuit board on the pin alignment plate comprises at least one latch arm for projecting through a mounting hole in the printed circuit board. The latch arm is flexible and includes a hook portion for snapping into latching engagement with one side of the printed circuit board as the latch arm is inserted through the mounting hole in the board. The housing includes a relatively rigid backup member for positioning behind the latch arm to prevent the latch arm from flexing out of engagement with the printed circuit board when the pin alignment plate is in its pin-exposing position.

According to another aspect of the invention, the combination of the electrical connector with a printed circuit board is contemplated, with the board having complementary mounting means, such as the mounting hole, for cooperating with the mounting means on the pin alignment plate to facilitate mounting the board on the plate.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIG. 9 is an enlarged, fragmented and sectional view of the left-hand end of FIG. 8;

DETAILED DESCRIPTION OF THE PREFERRED EMBODIMENT

Figure 1:
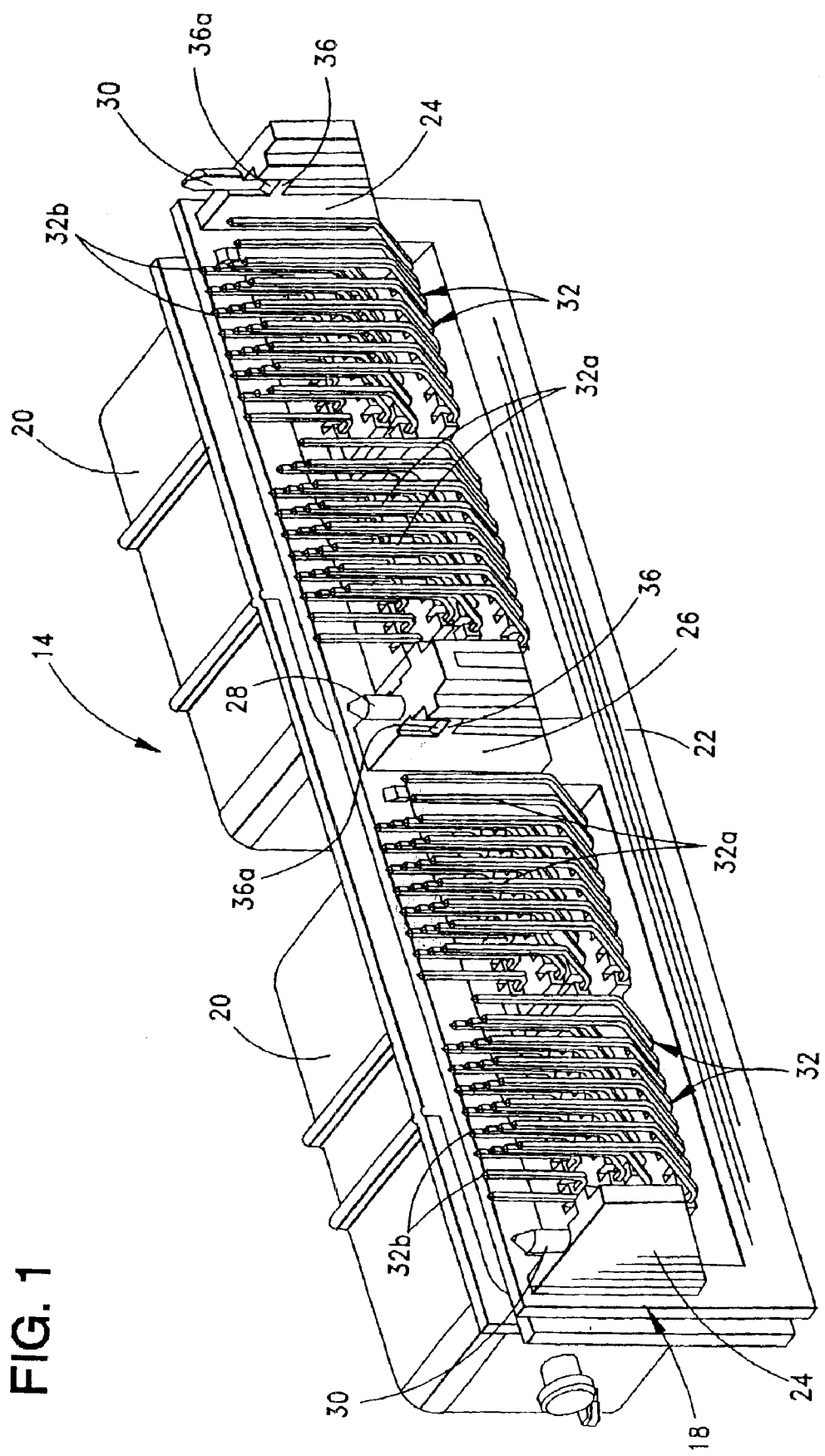
FIG. 1 is a perspective view of the rear or terminating end of a header connector for receiving the pin alignment plate of the invention.
Figure 2:
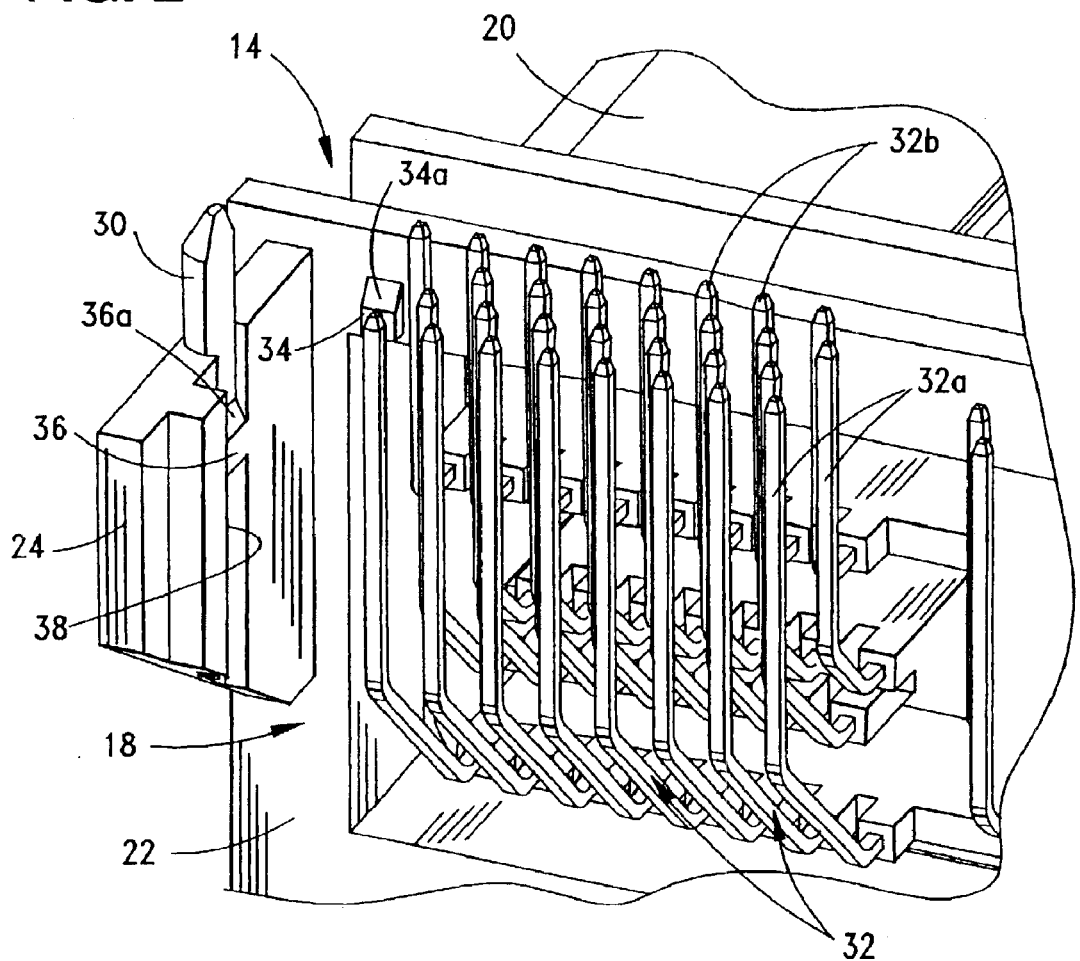
FIG. 2 is an enlarged fragmented perspective view of one end of the header connector.
Figure 3:
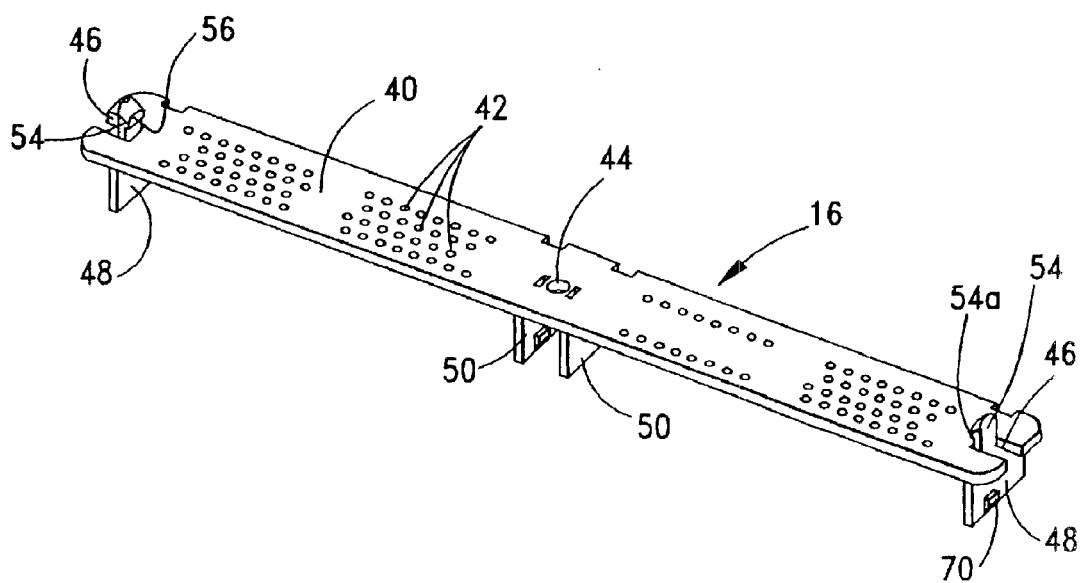
FIG. 3 is a perspective view of the pin alignment plate.
Figure 4:
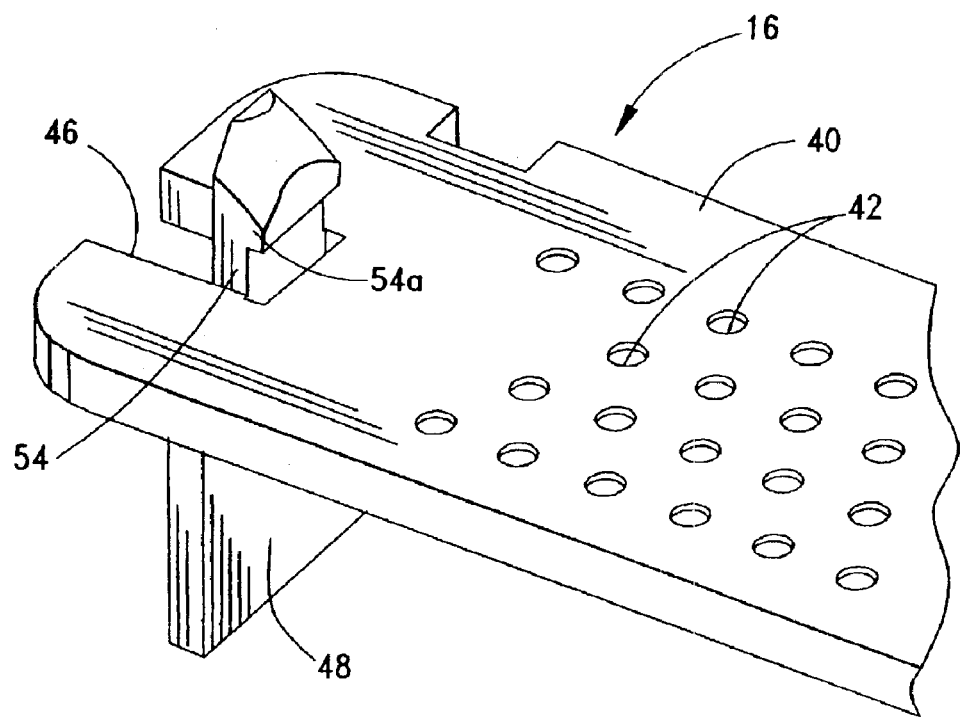
FIG. 4 is an enlarged, fragmented perspective view of the left-hand end of the pin alignment plate as viewed in FIG. 3.
Figure 5:
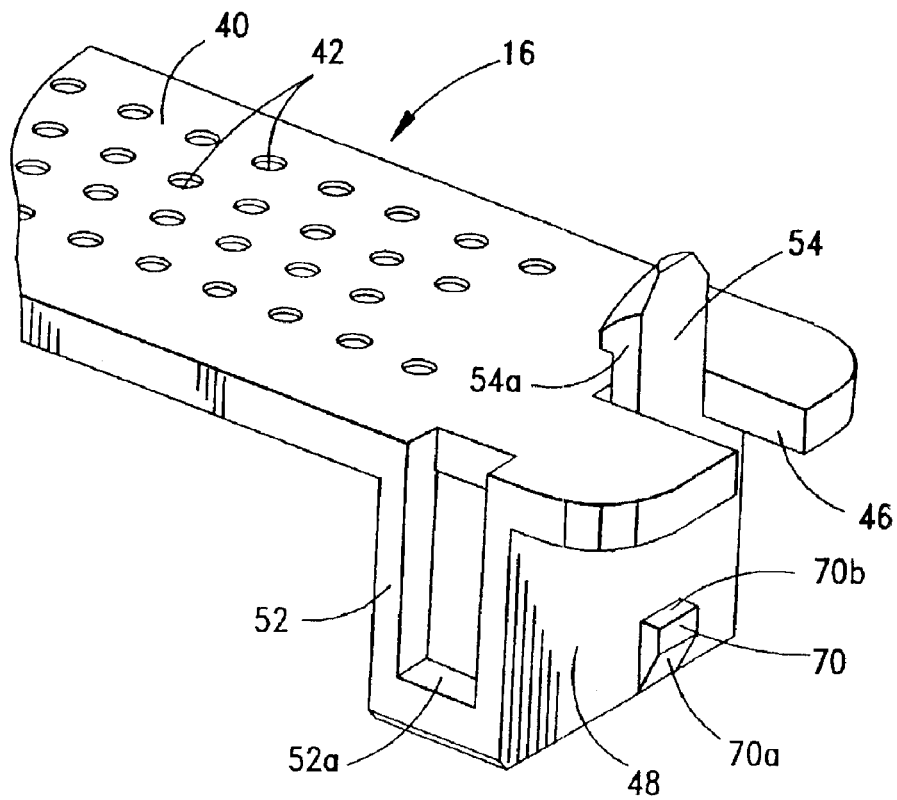
FIG. 5 is an enlarged, fragmented perspective view of the back side of the left-hand end of the pin alignment plate as viewed in FIG. 3.

Referring to the drawings in greater detail, FIGS. 1 and 2 show an electrical connector in the form of a header connector, generally designated 14, which mounts a pin alignment plate, generally designated 16 in FIGS. 3–5, according to the invention. It immediately should be understood that header connector 14 is but one example of an electrical connector with which the pin alignment plate system of the invention is applicable or useful.

With that understanding, and referring first to FIG. 1, header connector 14 includes a dielectric housing, generally designated 18, which may be unitarily molded of plastic material. The housing has a pair of forwardly projecting mating portions 20 for mating with a pair of complementary mating connectors (not shown). The housing defines a rear terminating face 22 from which a pair of end wings 24 and a center wing 26 project rearwardly from terminating face 22. A cylindrical center mounting post 28 projects upwardly from center wing 26, and a pair of semi-cylindrical mounting posts 30 project upwardly from end wings 24. Mounting post 30 form relaively rigid backup members for flexible latch arms on pin alignment plate 16 as will be described in detail hereinafter.

A plurality of conductive terminals, generally designated 32, are mounted in dielectric housing 18 of header connector 14. The terminals have contact portions (not visible in the drawings) which project into mating portions 20 for engaging the terminals of the complementary mating connectors. The terminals have pin portions 32a which project from rear terminating face 22 of housing 18 and which are bent at right angles to extend in the same direction as mounting posts 28 and 30. Pin portions 32a of the terminals have distal ends 32b.

Referring to FIG. 2 in conjunction with FIG. 1, a first latch boss 34 projects rearwardly from terminating face 22 of housing 18 inside each opposite end wing 24 and at opposite sides of center wing 26. This first latch boss has an upwardly facing chamfered or angled surface 34a, as viewed in the drawings. A second latch boss 36 is formed in a groove 38 inside each end wing 24 and on opposite sides of center wing 26. This second latch boss also has an upwardly facing chamfered or angled surface 36a. As will be seen in greater detail hereinafter, first latch bosses 34 are effective to hold pin alignment plate 16 in its outer protecting position, and second latch bosses 36 are effective to hold the pin alignment plate in its inner or pin-exposing position. Similarly, and referring to FIG. 1, a second latch boss 36, having a chamfered or angled surface 36a, is formed on each opposite side of center wing 26.

Referring to FIGS. 3–5, pin alignment plate 16 includes an elongated plate 40 having a plurality of apertures 42 for receiving pin portions 32a of terminals 32. Plate 40 has a center hole 44 which fits over center mounting post 28 (FIG. 1) of connector housing 18. An end notch 46 is formed at each opposite end of plate 40 for positioning over mounting posts 30 (FIG. 1) that project upwardly from end wings 24 of the connector housing. A pair of end flanges 48 project downwardly from plate 40 at opposite ends thereof, and a pair of spaced center flanges 50 project downwardly from plate 40 on opposite sides of center hole 44. As will be seen hereinafter, when pin alignment plate 16 is mounted to connector housing 18, end flanges 48 move along the insides of end wings 24 of the housing, and center flanges 50 straddle center wing 26 of the housing.

As seen best in FIG. 5, a pair of L-shaped legs 52 project inwardly from opposite edges of each end flange 48. Finally, a printed circuit board mounting post or latch arm 54 projects upwardly from each opposite end of plate 40, inside each end notch 46. Actually, the board mounting posts 54 are molded as upward extensions of end flanges 48 as best seen in FIG. 5. The board mounting posts or latch arms have inwardly projecting hooks 54a. The entire pin alignment plate may be unitarily molded of plastic material.

Figure 6:
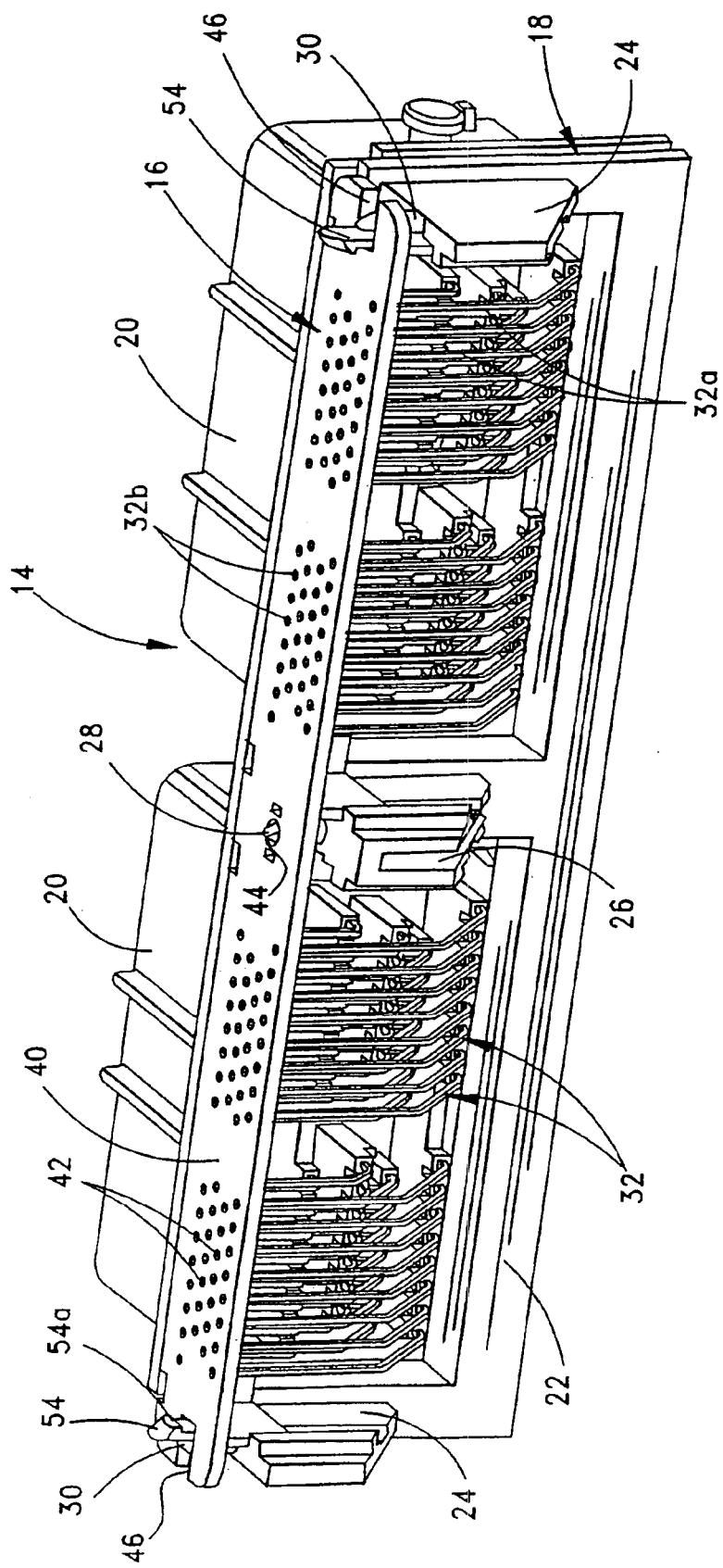
FIG. 6 is a perspective view of the header connector, with the pin alignment plate mounted thereto in its outer or protecting position.
Figure 7:
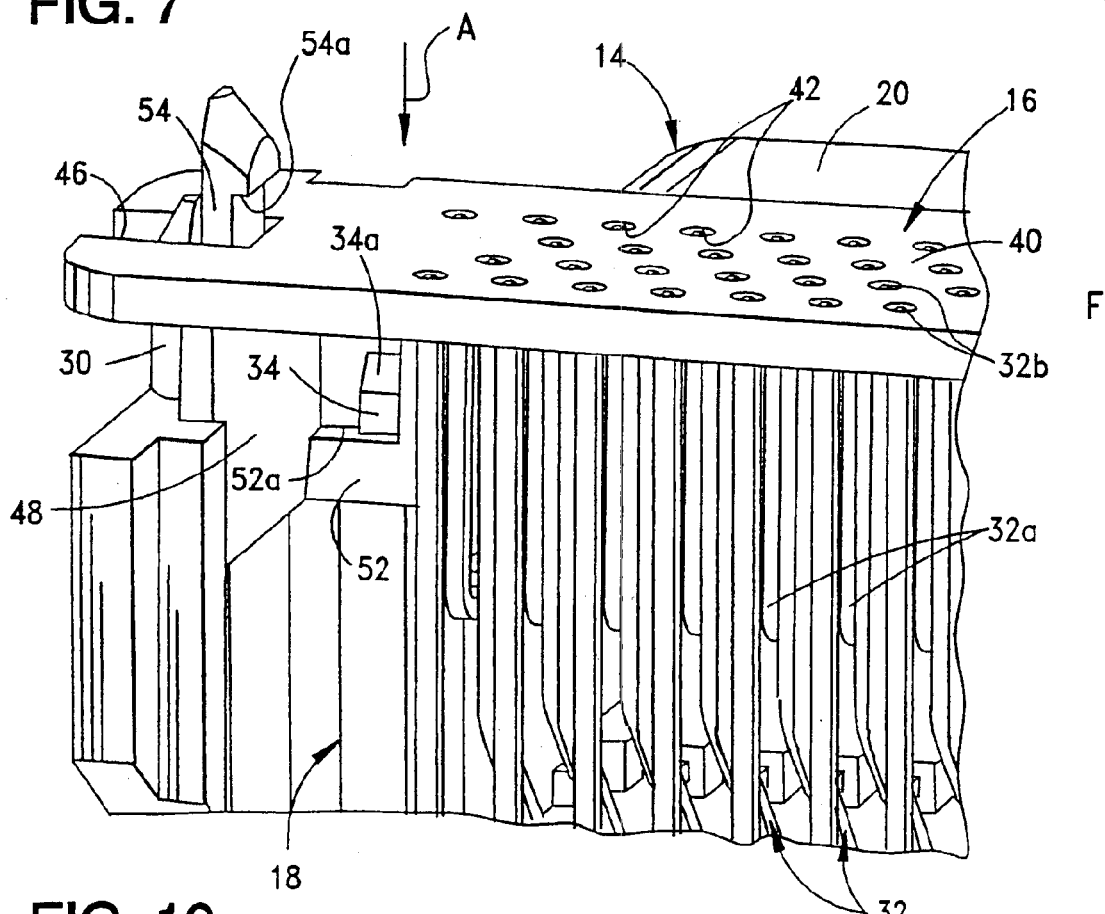
FIG. 7 is an enlarged, fragmented perspective view of the left-hand end of FIG. 6.

Generally, first complementary interengaging latch means are provided between pin alignment plate 16 and connector housing 18 for holding the plate in an outer or protecting position as shown in FIGS. 6 and 7. This first complementary interengaging latch means include the combination of first latch bosses 34 on connector housing 18 as described above and seen best in FIG. 2, along with a pair of latch ledges 52a defined by L-shaped legs 52 on pin alignment plate 16 as best seen in FIG. 5. This interengagement is shown clearly in FIG. 7. In other words, when pin alignment plate 16 is mounted onto connector housing 18 in the direction of arrow "A" (FIG. 7), L-shaped legs 52 of the pin alignment plate engage angled surfaces 34a of first latch bosses 34 and ride over the latch bosses until the legs "snap" into engagement beneath the underside of the latch bosses.

This defines the outer or protecting position of the pin alignment plate as seen in FIGS. 6 and 7. In this position, board mounting posts or latch arms 54 project upwardly through end notches 46 in the plate, and semi-cylindrical end mounting posts 30 on the connector housing are positioned behind board mounting posts 54. It can be seen in FIG. 7 that distal ends 32b of terminal pin portions 32a project into holes 42 in the pin alignment plate but do not project completely therethrough. In this outer position of the pin alignment plate, the pin portions are properly spaced, aligned and protected.

Figure 8:
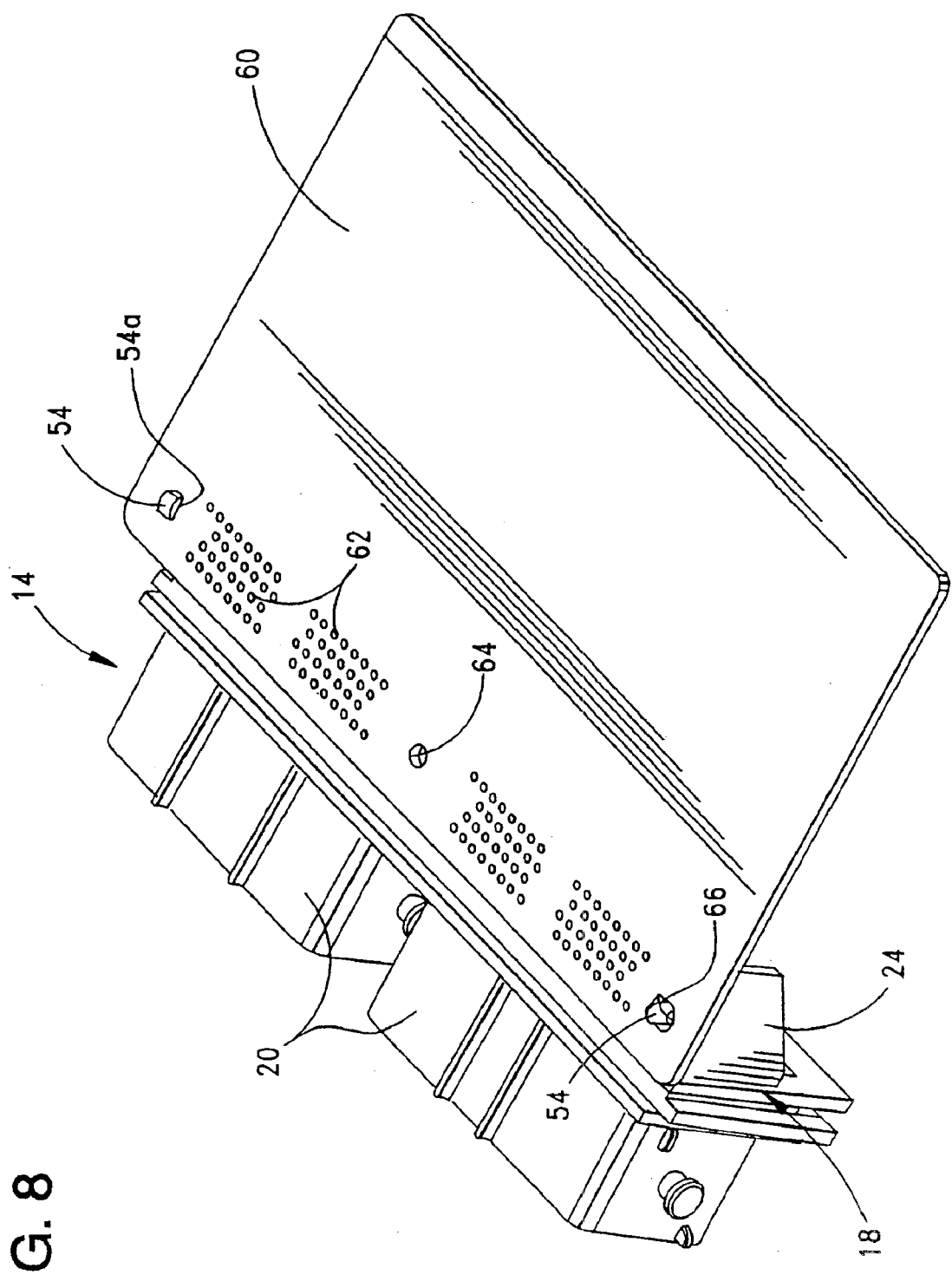
FIG. 8 is a perspective view of the header connector, with a printed circuit board mounted to the pin alignment plate and with the plate still in its outer or protecting position.

After pin alignment plate 16 is positioned on connector housing 18 in its outer or protecting position shown in FIGS. 6 and 7, a printed circuit board 60 then can be mounted onto the pin alignment plate as seen in FIGS. 8 and 9. The printed circuit board has a plurality of holes 62 through which pin portions 32a of terminals 32 are to be inserted for connection to appropriate circuit traces (not shown) on the board and/or in the holes. When the board is mounted on the pin alignment plate, holes 62 in the board are aligned with holes 42 in the plate. The board has a center mounting hole 64 (FIG. 8) for receiving center mounting post 28 (FIG. 1) of the connector housing. The board has a pair of end mounting holes 66 for receiving both mounting posts or latch arms 54 of the pin alignment plate as well as end mounting posts 30 of the connector housing.

When the circuit board is mounted on top of pin alignment plate 16, hooks 54a of latch arms 54 snap into engagement with the top surface of the board. With the pin alignment plate being molded of plastic material, mounting posts 54 are flexible and they perform a dual function of forming flexible latch arms for securing the printed circuit board to the top of the pin alignment plate.

Figure 10:
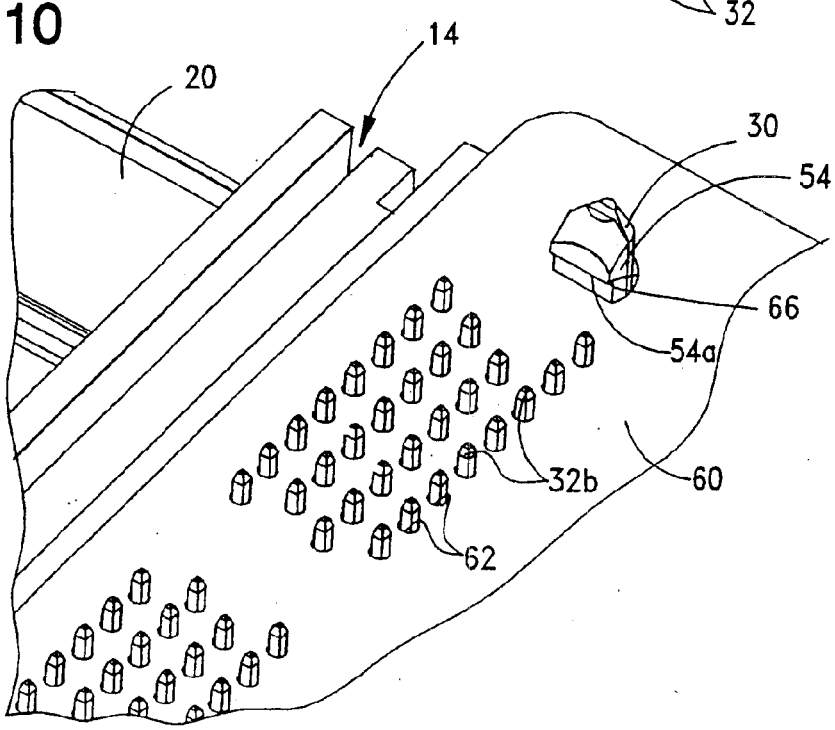
FIG. 10 is an enlarged, fragmented perspective view of one end of the assembly of FIGS. 8 and 9, with the pin alignment plate and printed circuit board conjointly moved to the pin-exposing position; and, FIG. 11 is a view similar to that of FIG. 9, but with the pin alignment plate and printed circuit board having been moved conjointly to the pin-exposing position of FIG. 10.

After printed circuit board 60 is mounted to pin alignment plate 16 as described above, both the board and the plate are conjointly movable to a pin-exposing position shown in FIGS. 10 and 11. Generally, second complementary interengaging latch means are provided between the pin alignment plate and the housing for holding the plate in this pin-exposing position. Specifically, referring back to FIG. 5, a latch boss 70 is formed on the outside of each end flange 48 of pin alignment plate 16. The latch boss has a leading (in the direction of movement) angled surface 70a and a trailing, abrupt latch surface 70b. Latch bosses 70 on the pin alignment plate cooperate with second latch bosses 36 on the connector housing as described above in relation to FIG. 2, to define the second complementary interengaging latch means for holding the alignment plate in its pin-exposing position as shown in FIGS. 10 and 11.

This interengagement is seen clearly in FIG. 11 where latch surface 70b of one of the latch bosses 70 on pin alignment plate 16 is shown engaged with the bottom of one of the latch bosses 36 on the connector housing. During movement of the pin alignment plate and printed circuit board to the pin-exposing position, leading angled surfaces 70a of latch bosses 70 engage angled surfaces 36a of latch bosses 36 as the pin alignment plate moves in the direction of arrow "B" (FIG. 11). This causes latch bosses 70 on flanges 58 to ride over latch bosses 36 and snap into interengagement as seen in FIG. 11.

FIG. 11 also shows that semi-cylindrical end mounting posts 30 on connector housing 18 move into a position behind board mounting posts or flexible latch arms 54 of the pin alignment plate. This prevents hooks 54a of flexible latch arms 54 from moving out of securing engagement with the top surface of printed circuit board 60. In this pin-exposing position of the pin alignment plate and the circuit board, it can be seen in both FIGS. 10 and 11 that distal ends 32b of pin portions 32 project completely through holes 62 in circuit board 60. The pin portions now can be electrically connected to appropriate circuit traces on the board and/or in the holes.

Angled surfaces 70a of latch bosses 70 as described above in relation to FIGS. 5 and 11, also perform an abutting function to further define the outer protecting position of pin alignment plate 16. This is seen in FIG. 9 wherein angled surface 70a abuts against angled surface 36a of second latch boss 36 on the connector housing. In FIG. 9, it can be seen that first latch boss 34 is in engagement with latch surface 52a while angled surfaces 36a and 70a are in interengagement. This positively defines the outer or protecting position of the pin alignment plate and printed circuit board in opposite directions. When the pin alignment plate and printed circuit board are moved to the inner pin-exposing position of FIGS. 10 and 11, the pin alignment plate abuts the top surfaces of end wings 24 and center wing 26 (FIG. 1).

The invention has a variety of applications. For instance, certain manufacturers may manufacture electrical connectors while other manufacturers manufacture printed circuit boards. With the invention, electrical connector 14 can be manufactured with pin alignment plate 16 mounted thereto for protecting pin portions 32a of terminals 32 during handling and transit. Printed circuit board 60 subsequently can be added to this combination, with both the circuit board and the pin alignment plate still in its pin-protecting position. During further handling to other processing stations, such as a reflow soldering processing station for electrically connecting the pin portions of the terminals to the circuit traces on the printed circuit board, the board and pin alignment plate can remain in the protecting position until it is necessary to expose the distal ends of the pin portions for ultimate processing. In addition, it often is difficult to insert terminal pins into holes in printed circuit boards without making the holes in the board unduly large. With the invention, the holes in pin alignment plate 16 can be chamfered for easy insertion of the distal ends of the pin portions thereinto and to prealign the distal ends of the pin portions with the holes in the printed circuit board which can be precisely mounted to the top of the pin alignment plate.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. An electrical connector, comprising:

dielectric housing;

plurality of conductive terminals mounted on the housing with pin portions projecting therefrom; and a pin alignment plate having a plurality of apertures for receiving the pin portions of the terminals, the pin alignment plate being movably mounted on the housing for movement from an outer protecting position generally at distal ends of said pin portions to an inner pin-exposing position spaced inwardly of said distal ends, and said pin alignment plate having mounting means for fixing a printed circuit board thereon in the outer protecting position of the alignment plate for movement inwardly therewith between said positions.

2. The electrical connector of claim 1, further including complementary interengaging latch means between said pin alignment plate and said housing for holding said pin alignment plate in said protecting position.

3. The electrical connector of claim 1, further including complementary interengaging latch means between aid pin alignment plate and said housing for holding said pin alignment plate in said pin-exposing position.

4. The electrical connector of claim 3, further including additional complementary interengaging latch means between said pin alignment plate and said housing for holding said pin alignment plate in said protecting position.

5. In combination with the electrical connector of claim 1, a printed circuit board having complementary mounting means for cooperating with said mounting means on said pin alignment plate to facilitate mounting the printed circuit board on said pin alignment plate.

6. The combination of claim 5, wherein said mounting means on said pin alignment plate comprise at least one latch arm, and the complementary mounting means on the printed circuit board comprise a hole for receiving the latch arm.

7. The electrical connector of claim 1, wherein said mounting means comprises at least one arm for projecting through a mounting hole in said printed circuit board.

8. The electrical connector of claim 7, wherein said arm is a latch arm and is flexible for resiliently latchingly engaging said printed circuit board, and said housing includes a relatively rigid backup member for positioning behind the latch arm to prevent said latch arm from flexing out of latching engagement with said printed circuit board when said pin alignment plate is in said pin-exposing position.

9. The electrical connector of claim 7, wherein said arm is flexible and includes a hook portion for snapping into latching engagement with one side of said printed circuit board as said arm is inserted through the mounting hole in said printed circuit board.

10. The electrical connector of claim 9, wherein said housing includes a relatively rigid backup member for positioning behind said arm to prevent said arm from flexing out of engagement with said printed circuit board when said pin alignment plate is in said pin-exposing position.

11. An electrical connector, comprising:

a dielectric housing;

a plurality of conductive terminals mounted on the housing with pin portions projecting therefrom;

a pin alignment plate having a plurality of apertures for receiving the pin portions of the terminals, the pin alignment plate being movably mounted on the housing for movement from an outer protecting position generally at distal ends of said pin portions to an inner pin-exposing position spaced inwardly of said distal ends, and said pin alignment plate having at least one latch arm for projecting through a mounting hole in a printed circuit board to latch the printed circuit board to said pin alignment plate in the outer protecting position of the alignment plate for movement inwardly therewith between said positions;

first complementary interengaging latch means between aid pin alignment plate and said housing for holding said pin alignment plate in said protecting position; and, second complementary interengaging latch means between said pin alignment plate and said housing for holding said pin alignment plate in said pin-exposing position.

12. The electrical connector of claim 11, wherein said latch arm is flexible and includes a hook portion for snapping into latching engagement with one side of said printed circuit board as said latch arm is inserted through the mounting hole in said printed circuit board.

13. The electrical connector of claim 12, wherein said housing includes a relatively rigid backup member for positioning behind said latch arm to prevent said latch arm from flexing out of engagement with said printed circuit board when said pin alignment plate is in said pin-exposing position.

14. The electrical connector of claim 11, wherein said latch arm is flexible for resiliently latchingly engaging said printed circuit board, and said housing includes a relatively rigid backup member for positioning behind said latch arm to prevent said latch arm from flexing out of latching engagement with said printed circuit board when said pin alignment plate is in said pin-exposing position.

15. The electrical connector of claim 14, wherein said housing includes a mounting post for projecting through a mounting hole in said pin alignment plate, said mounting post performing a dual function of comprising said backup member for positioning behind said flexible latch arm.

16. In combination with the electrical connector of claim 11, a printed circuit board having complementary mounting means for cooperating with said mounting means on said pin alignment plate to facilitate mounting said printed circuit board on said pin alignment plate.

17. In combination of claim 16, wherein said mounting means on said pin alignment plate comprise at least one latch arm, and the complementary mounting means on said printed circuit board comprise a hole for receiving said latch.

18. An electrical connector, comprising:

a dielectric housing;

a plurality of conductive terminals mounted on the housing with pin portions projecting therefrom;

a pin alignment plate having a plurality of apertures for receiving the pin portions of the terminals, the pin alignment plate being movably mounted on the housing for movement from a protecting position generally at distal ends of said pin portions to a pin-exposing position spaced inwardly of said distal ends, and said pin alignment plate having mounting means for mounting a printed circuit board thereon for movement therewith between said positions, said mounting means comprising at least one flexible arm for projecting through a mounting hole in said printed circuit board, the flexible arm including a hook portion for snapping into latching engagement with one side of said printed circuit board as said arm is inserted through the mounting hole in said printed circuit board; and said housing including a relatively rigid backup member for positioning behind said flexible arm to prevent said arm from flexing out of engagement with said printed circuit board when said pin alignment plate is in said pin-exposing position.

19. An electrical connector, comprising:

a dielectric housing;

a plurality of conductive terminals mounted on the housing with pin portions projecting therefrom;

a pin alignment plate having a plurality of apertures for receiving the pin portions of the terminals, the pin alignment plate being movably mounted on the housing for movement from a protecting position generally at distal ends of said pin portions to a pin-exposing position spaced inwardly of said distal ends, and said pin alignment plate having mounting means for mounting a printed circuit board thereon for movement therewith between said positions, said mounting means comprising at least one flexible latch arm for resiliently latchingly engaging said printed circuit board; and said housing including a relatively rigid backup member for positioning behind the flexible latch arm to prevent said latch arm from flexing out of latching engagement with said printed circuit board when said pin alignment plate is in said pin-exposing position.

20. An electrical connector, comprising:

a dielectric housing;

a plurality of conductive terminals mounted on the housing with pin portions projecting therefrom;

a pin alignment plate having a plurality of apertures for receiving the pin portions of the terminals, the pin alignment plate being movably mounted on the housing for movement from a protecting position generally at distal ends of said pin portions to a pin-exposing position spaced inwardly of said distal ends, and said pin alignment plate having at least one latch arm for projecting through a mounting hole in a printed circuit board to mount the printed circuit board on said pin alignment plate for movement therewith between said positions, said latch arm being flexible and including a hook portion for snapping into latching engagement with one side of said printed circuit board as said latch arm is inserted through the mounting hole in said printed circuit board;

first complementary interengaging latch means between aid pin alignment plate and said housing for holding said pin alignment plate in said protecting position;

second complementary interengaging latch means between said pin alignment plate and said housing for holding said pin alignment plate in said pin-exposing position; and said housing including a relatively rigid backup member for positioning behind said latch arm to prevent said latch arm from flexing out of engagement with said printed circuit board when said pin alignment plate is in said pin-exposing position.

21. An electrical connector, comprising:

a dielectric housing;

a plurality of conductive terminals mounted on the housing with pin portions projecting therefrom;

a pin alignment plate having a plurality of apertures for receiving the pin portions of the terminals, the pin alignment plate being movably mounted on the housing for movement from a protecting position generally at distal ends of said pin portions to a pin-exposing position spaced inwardly of said distal ends, and said pin alignment plate having at least one latch arm for projecting through a mounting hole in a printed circuit board to mount the printed circuit board on said pin alignment plate for movement therewith between said positions, said latch arm being flexible for resiliently latchingly engaging said printed circuit board;

first complementary interengaging latch means between aid pin alignment plate and said housing for holding said pin alignment plate in said protecting position;

second complementary interengaging latch means between said pin alignment plate and said housing for holding said pin alignment plate in said pin-exposing position; and said housing including a relatively rigid backup member for positioning behind said latch arm to prevent said latch arm from flexing out of latching engagement with said printed circuit board when said pin alignment plate is in said pin-exposing position.

22. An electrical connector of claim 21, wherein said housing includes a mounting post for projecting through a mounting hole in said pin alignment plate, said mounting post performing a dual function of comprising said backup member for positioning behind said flexible latch arm.

* * * * *